United States Patent [19]

Do

[11] Patent Number: 5,202,851
[45] Date of Patent: Apr. 13, 1993

[54] WORD LINE DRIVING CIRCUIT

[75] Inventor: Jung-Kee Do, Anyang, Rep. of Korea

[73] Assignee: Goldstar Electron Co., Ltd., Rep. of Korea

[21] Appl. No.: 665,698

[22] Filed: Mar. 7, 1991

[30] Foreign Application Priority Data

Mar. 9, 1990 [KR] Rep. of Korea ................. 903167

[51] Int. Cl.$^5$ ............................................. G11C 13/00
[52] U.S. Cl. ................................................. 365/189.01
[58] Field of Search ................ 365/189.01, 189.04, 365/230.01, 189.05, 189.11

[56] References Cited

U.S. PATENT DOCUMENTS 4,860,255 6/1992 Shimohigashi et al. ........ 365/189.01
5,031,149 7/1991 Matsumoto et al. ............ 365/189.11

*Primary Examiner*—Terrell W. Fears
*Attorney, Agent, or Firm*—Blakely, Sokoloff, Taylor & Zafman

[57] ABSTRACT

A word line driving circuit is disclosed which is constituted such that a word line driving circuit is attached to a word line, and an accelerating circuit is added o the word line driving circuit. The word line driving circuit comprises: a NAND gate receiving address signals; an N-MOS transistor 4 with its gate connected to the output terminal of the NAND gate; and an N-MOS transistor 3 with its gate connected through an inverter to the output terminal of the NAND gate; the N-MOS transistor 4 being also connected to a ground terminal Vss and to the N-MOS transistor 3. According to the present invention, the layout area can be kept to the minimum, and the time delay can be prevented during the pull-up and pull-down of the word line.

3 Claims, 2 Drawing Sheets

$VDD-VT < VDD < VDD+\Delta V < VDD+\Delta V'$
$VT \doteq N$-MOS THRESHOLD VOLTAGE

WORD LINE DRIVING CIRCUIT

FIELD OF THE INVENTION

The present invention relates to a word line driving circuit for MOS memory, and particularly to a word line driving circuit in which an accelerating circuit is used in order to pull up the word line above the cell operating voltage in driving the word line of DRAM.

BACKGROUND OF THE INVENTION

As shown in FIG. 1, the conventional word line driving circuit comprises: a NAND gate 1 including a decoder; and inverter 2; and N-MOS transistors 3, 4, 7, the components being so arranged as to drive a word line 8 which is connected to a node N4.

Meanwhile, the word line 8 is connected to several or tens of thousands of memory cells 100-100n, and the function of the word line 8 is to drive the transistors assigned to the memory cells.

FIG. 2 is a timing chart showing the operations of the circuit of FIG. 1, and the operations of the circuit of FIG. 1 will be described referring to FIG. 2.

A plurality of address input signals Axl-Axn of FIG. 1 are in a low state, i.e., in a non-activated state, a node N1 will have a high level, and nodes N2-N4 will have a low level as shown in FIG. 2, so that the word line 8 should be in a low state, i.e., in a turned-off state. Then, if the plurality of the address signals Axl-Axn are all shifted to a high level to start an operation, then the output of the NAND gate 1 will have a low level, an N-MOS transistor 7 will be turned off by the node N1 of a low state, the node N2 will be shifted to a high level by the node N2, and an N-MOS transistor 3 will be turned on by a power source voltage VDD, thereby ultimately shifting the node N3.

Meanwhile, the supplying time for an input signal I1 is variable depending on the circumstance, and an input signal as high as VDD+$\Delta$V is supplied to the DRAM in order to pull up the voltage of the word line above the power source voltage VDD.

Thus if the input signal I1 is supplied, then as shown by the dotted lines in FIG. 1, the voltage of the node N3 is boosted above the power source voltage VDD because of the parasitic capacitances G1, G2 (these are produced in a parasitic manner owing to the intrinsic characteristics of MOS process).

Meanwhile, no current path from the node N3 to the node N2 is formed because of the voltage of the node N2 and the voltage VDD of the gate of the N-MOS transistor 3 so as for the boosted voltage of the node N3 to be maintained, and consequently, an input signal having a voltage higher than the voltage VDD is transmitted through an N-MOS transistor 4 to the word line 8.

However, the word line is connected to a large number of cells, and therefore, in the technical constitution of the conventional circuit, there is a severe difference of operational characteristics due to the time delay between the input side of the word line and the end of the word line. Further, the N-MOS transistor 3 is required for supplying a high voltage to the word line, and the N-MOS transistors 3,4 have to have a large size because the N-MOS transistor 4 receives a high pressure when transferring large amounts of current.

Further, the inputs I1 are commonly used for a large number of the word lines at a time, and therefore, a high load is imposed.

Further, a high voltage is required in driving all the word lines, and therefore, a great difficulty is encountered in designing the voltage amplifying circuit.

SUMMARY OF THE INVENTION

The present invention is intended to overcome the above described disadvantages of the conventional circuit.

Therefore, it is the object of the present invention to provide a word line driving circuit in which the lay-out area can be kept to a minimum by separating the word line driving circuit, the time delay can be prevented during the pull-down and pull-up of the word line, and the power consumption can be saved.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 3:
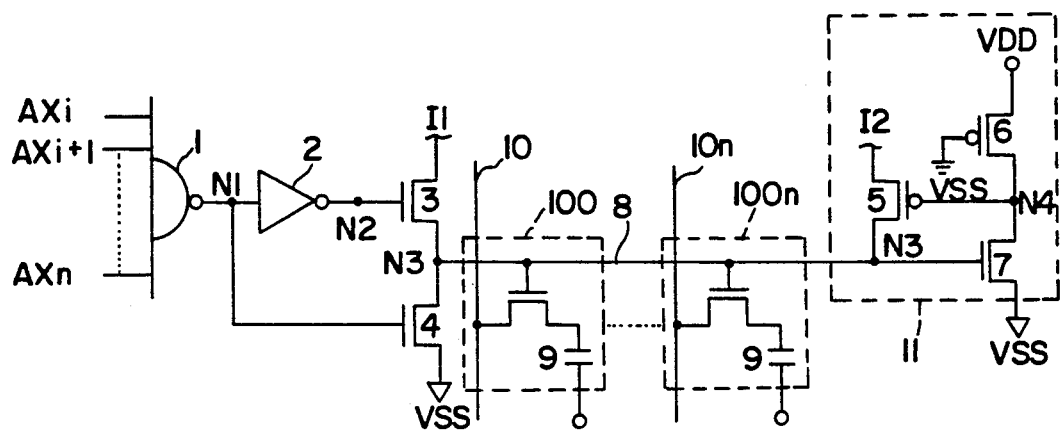
FIG. 3 is a circuital illustration of the word line driving circuit according to the present invention.

Referring to FIG. 3, a word line accelerating circuit 11 comprises: P-MOS transistors 5,6, an input signal I2, power terminals VDD, VSS, and an N-MOS transistor 7 connected to a node N3 which constitutes a word line 8. A word line driving circuit for properly operating the word line accelerating circuit 11 comprises: an inverter 2; N-MOS transistors 3,4; an input signal terminal I1; and a NAND gate 1 for receiving a plurality of address input signals Axl-Axn.

The circuit of the present invention constituted as above will now be described as to its operations referring to the timing chart of FIG. 4.

Figure 4:
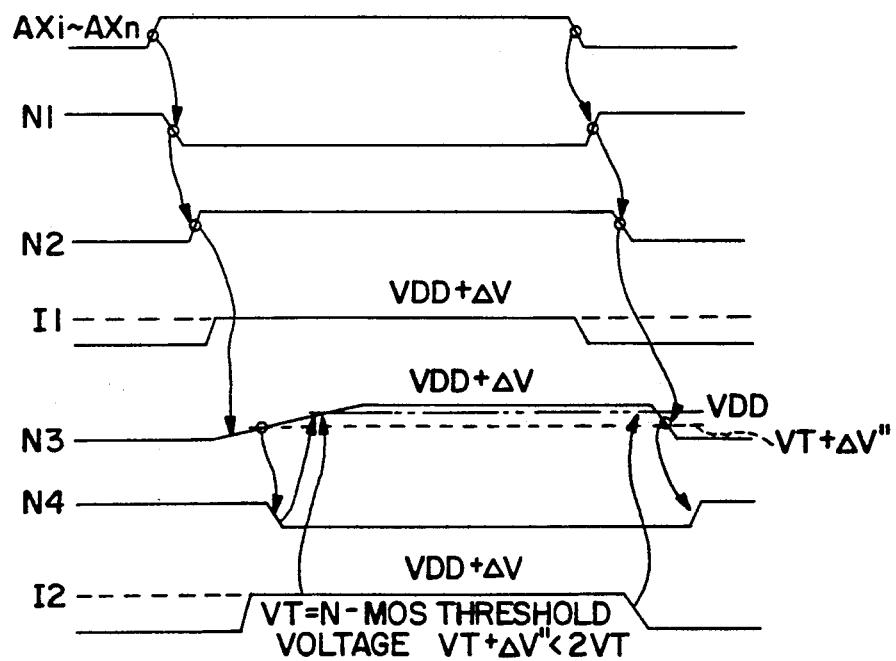
FIG. 4 is a timing chart for the circuit of FIG. 3.

In FIG. 4, the portions shown by the dotted lines indicate the possibility of a more effective operation, while the portion shown by the 2-dot chain line indicates the level VDD.

Meanwhile, $\Delta$V indicates the threshold voltage of ordinary MOS transistors or a similar voltage, while input signals I1, I2 indicate signals which can be supplied to the whole circuit such as DRAM, and which can be usually arbitrarily supplied for unit circuits.

If the address input signals Axl-Axn of FIG. 3 are shifted from a low level to a high level, then the node N1 is shifted to a low state so as for the MOS transistor 4 to be turned off.

Under this condition, the transistor 7 is in a turned-off state owing to the function of the node N3, and the pull-up transistor 6 is in a turned-on state. Accordingly, the P-MOS transistor 5 is turned off, and the node N3 is maintained in a low state regardless of the input signal I2. Then the node N1 of a low state is shifted to a high state by the function of the node N2, the N-MOS transistor 3 is turned on, and then, the node N3 begins to be pulled up to a high state upon supplying the input signal I1 to the node N3.

Figure 1:
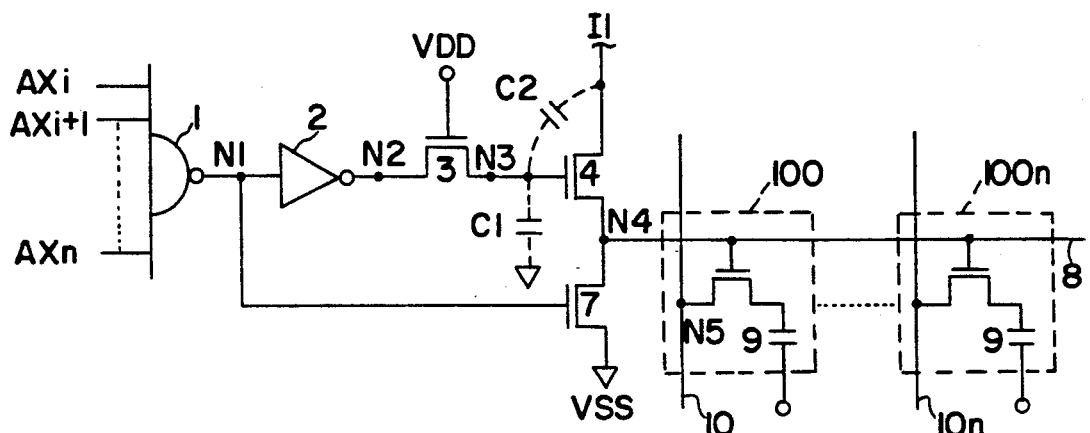
FIG. 1 is a circuital illustration of the conventional word line driving circuit.
Figure 2:
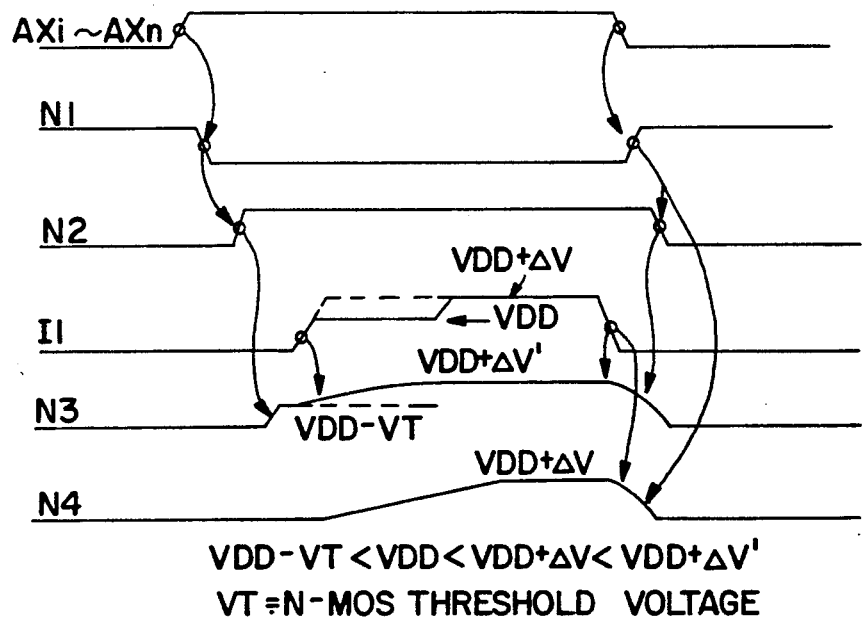
FIG. 2 is a timing chart for the circuit of FIG. 1.

Here, in the case of the conventional technique of FIG. 1, if the input signal I1 is shifted to a high state in advance, the boosting of the voltage of the node N3 can not be achieved, and therefore, the input signal I1 can not be shifted to a high state in advance, but requires a time delay, with the result that the operating speed of the memory is slowed down.

According to the present invention, however, the boosting is not required, and therefore, the time delay is also not required.

Then, if the voltage of the node N3 in FIG. 3 exceeds the threshold voltage of the N-MOS transistor 7, the node N4 is shifted to a low state, and the P-MOS transistor 5 is turned on, so that the input signal I2 (VDD+$\Delta$V) should be supplied to the node N3.

That is, the transistors 3,5 pull up the word line 8 from the opposite ends thereof so as for the time delay of the word line of the same line to be minimized, and no boosting is required when the transistor 5 consisting of a P-MOS transistor supplies a voltage of VDD+$\Delta$V.

During the pulling-down of the word line WL, the input signal I2 has a low state, and therefore, the P-MOS transistor 5 works as a pull-down transistor, so that the node N3 should be pulled down to a low state, and that the node N1 should be shifted to a high state. As a result, the N-MOS transistor 4 is turned on, and therefore, the pulling-down of the node N3 is simultaneously carried out also by the N-MOS transistor 4, so that the time delay for pulling-down the word line 8 should be minimized.

Further, if the node N3 comes to have a low state, then the N-MOS transistor 7 is turned off, and the node N4 is shifted to a high state by the pulling-down action of the P-MOS transistor 6, so that the operation should return to the initial state, thereby completing the operation.

According to the present invention described above, the word line driving circuit which is difficult to lay-out is separated from the memory device, so that the lay-out area should be kept to the minimum, and the time delay can be prevented during the pull-down/pull-up of the word line. Therefore, it is possible to design a high speed access memory, and to keep the power consumption to the minimum because the transistors are operated under the optimum conditions.

What is claimed is:

1. A word line driving circuit comprising: a NAND gate having at least one input terminal for receiving address signals; a first N-MOS transistor with its gate connected to an output terminal of said NAND gate; a second N-MOS transistor, with its gate connected through an inverter to the output terminal of said NAND gate; said first N-MOS transistor being connected to a ground terminal and to said second N-MOS transistor, said second N-MOS transistor being configured for receiving a first input signal, and a node of said first N-MOS transistor being connected to a word line for at least one memory cell; the above components constituting the word line driving circuit; and an accelerating circuit added to said word line and to the side opposite from said word line driving circuit.

2. The word line driving circuit as claimed in claim 1, wherein said accelerating circuit comprises: a first P-MOS transistor receiving a second input signal and connected to said word line; a third N-MOS transistor with its gate connected to said word line and with its source connected to said ground terminal; and a second P-MOS transistor with its gate connected to said ground terminal, and with its drain connected to the gate of said first P-MOS transistor and to the drain of said third N-MOS transistor.

3. The word line driving circuit as claimed in any one of claims 1 or 2, wherein said first P-MOS transistor can be driven both in pull-up and pull-down directions.

* * * * *